US012341513B2

(12) United States Patent
Chen et al.

(10) Patent No.: US 12,341,513 B2
(45) Date of Patent: Jun. 24, 2025

(54) DRIVING VOLTAGE GENERATING DEVICE

(71) Applicant: LEAP Semiconductor Corp., Taoyuan (TW)

(72) Inventors: Wei-Fan Chen, Taichung (TW); Kuo-Chi Tsai, Taoyuan (TW)

(73) Assignee: LEAP Semiconductor Corp., Taoyuan (TW)

( * ) Notice: Subject to any disclaimer, the term of this patent is extended or adjusted under 35 U.S.C. 154(b) by 469 days.

(21) Appl. No.: 17/979,731

(22) Filed: Nov. 2, 2022

(65) Prior Publication Data

US 2024/0102868 A1 Mar. 28, 2024

(30) Foreign Application Priority Data

Sep. 26, 2022 (TW) .................................. 111136340

(51) Int. Cl.
*H03K 19/21* (2006.01)
*H02H 5/04* (2006.01)
*H02M 3/07* (2006.01)
*H03K 17/0812* (2006.01)
*H03K 17/08* (2006.01)

(52) U.S. Cl.
CPC ............... *H03K 19/21* (2013.01); *H02H 5/04* (2013.01); *H02M 3/07* (2013.01); *H03K 17/08122* (2013.01); *H03K 2017/0806* (2013.01)

(58) Field of Classification Search
CPC ........... H03K 19/21; H03K 2017/0806; H02H 5/04; H02M 3/07
See application file for complete search history.

(56) References Cited

U.S. PATENT DOCUMENTS 5,119,265 A * 6/1992 Qualich ................. H03K 17/08
 361/103
5,396,119 A * 3/1995 Brasca ................... H10D 89/00
 327/566

(Continued)

FOREIGN PATENT DOCUMENTS

TW 201414199 4/2014

OTHER PUBLICATIONS

"Office Action of Taiwan Counterpart Application", issued on Sep. 4, 2023, p. 1-p. 9.
Giovanni Pangallo et al., "Use of Body-Diode for Thermal Monitoring of Power MOSFET", Sensordevices 2018 : The Ninth International Conference on Sensor Device Technologies and Applications, Sep. 16, 2018, pp. 132-135.

(Continued)

*Primary Examiner* — Scott Bauer
(74) *Attorney, Agent, or Firm* — JCIPRNET

(57) ABSTRACT

A driving voltage generating device includes a temperature detector, a controlling circuitry, a voltage generator, and an output stage circuitry. The temperature detector is coupled to a control terminal of a power transistor and is configured to generate temperature detection information by detecting an ambient temperature. The controlling circuitry is coupled to the temperature detector and generates an activation signal by determining whether the ambient temperature is abnormal according to the temperature detection information. The voltage generator generates an operation power according to the activation signal. The output stage circuitry is coupled to the voltage generator, generates a driving voltage according to the operation power, and provides the driving voltage to the control terminal of the power transistor.

20 Claims, 10 Drawing Sheets

(56) References Cited

U.S. PATENT DOCUMENTS

| | | | |
|---|---|---|---|
| 6,046,470 | A | 4/2000 | Williams et al. |
| 6,111,379 | A | 8/2000 | Feldtkeller |
| 6,597,556 | B1 * | 7/2003 | Michel ................... H03K 17/16 361/103 |
| 7,368,784 | B2 | 5/2008 | Botti et al. |
| 7,782,584 | B2 * | 8/2010 | Watanabe .............. H01H 37/76 361/103 |
| 9,136,199 | B2 * | 9/2015 | Kartal ..................... H01L 23/34 |
| 10,833,668 | B2 | 11/2020 | Lai et al. |
| 2007/0216461 | A1 * | 9/2007 | Morino .............. H03K 17/0822 327/287 |
| 2008/0129267 | A1 | 6/2008 | Lenz |
| 2008/0265935 | A1 | 10/2008 | Bakker et al. |
| 2009/0072887 | A1 * | 3/2009 | Scheikl .............. H03K 17/0822 327/530 |
| 2011/0051302 | A1 | 3/2011 | Dibra |
| 2012/0146782 | A1 * | 6/2012 | Komatsu ................ H03K 17/18 340/653 |
| 2013/0153900 | A1 | 6/2013 | Kinouchi et al. |
| 2014/0043076 | A1 | 2/2014 | Hesener |
| 2016/0365721 | A1 | 12/2016 | Soma et al. |
| 2017/0325306 | A1 | 11/2017 | Mishra et al. |
| 2021/0091119 | A1 | 3/2021 | Matsumoto |
| 2021/0126632 | A1 | 4/2021 | Illing et al. |

OTHER PUBLICATIONS

Y. Wang et al., "Achieving Low Sheet Resistance from Implanted P-type Layers in 4H—SiC using High Temperature Graphite Capped Annealing", Materials Science Forum vols. 556-557, Sep. 15, 2007, pp. 1-5.

D. M. Nguyen et al., "Comparison of Electrical Properties of Ohmic Contact Realized on p-type 4H—SiC", Materials Science Forum vols. 600-603, Sep. 26, 2008, pp. 1-5.

Maxime Berthou et al., "Monolithically Integrated Temperature Sensor in Silicon Carbide Power MOSFETs", IEEE Transactions on Power Electronics, vol. 29, No. 9, Nov. 7, 2013, pp. 4970-4977.

M. A. Capano et al., "Ionization energies and electron mobilities in phosphorus- and nitrogen-implanted 4H-silicon carbide", Journal of Applied Physics, vol. 87, No. 12, Jun. 15, 2000, pp. 1-6.

Manjula S. Raman et al., "Physical Model for the Resistivity and Temperature Coefficient of Resistivity in Heavily Doped Polysilicon", IEEE Transactions on Electron Devices, vol. 53, No. 8, Jul. 24, 2006, pp. 1885-1892.

Xiao-Yu Tang et al., "Characteristics and Breakdown Behaviors of Polysilicon Resistors for High Voltage Applications", Advances in Condensed Matter Physics, vol. 2015, Article ID 423074, Apr. 27, 2015, pp. 1-5.

* cited by examiner

DRIVING VOLTAGE GENERATING DEVICE

CROSS-REFERENCE TO RELATED APPLICATION

This application claims the priority benefit of Taiwanese application no. 111136340, filed on Sep. 26, 2022. The entirety of the above-mentioned patent application is hereby incorporated by reference herein and made a part of this specification.

BACKGROUND

Technical Field

The disclosure relates to a driving voltage generating device. In particular, the disclosure relates to a driving voltage generating device in which a power transistor is ensured to operate in a safe operation area (SOA).

Description of Related Art

Since a power transistor typically operates in a high temperature environment, the power transistor is sensitive to an upper limit of operating temperature. When transition occurs in the power transistor that operates in an environment at the upper limit of temperature, the power transistor is likely to be damaged.

Based on the above, ambient temperature detection may be important for operation of the power transistor. The point is whether a response speed of a temperature detection circuit for temperature detection is sufficiently fast to protect the power transistor from damage. However, if the temperature detection circuit is designed to be excessively sensitive, it may cause incorrect operation of the temperature detection operation and erroneously turn off the power transistor. Therefore, how to design a temperature detection circuit that is capable of correct determination and can quickly respond to over-temperature is a topic for those skilled in the art.

SUMMARY

The disclosure provides a driving voltage generating device in which a power transistor is ensured to operate in a safe operation area (SOA).

According to an embodiment of the disclosure, a driving voltage generating device is configured to drive a power transistor and includes a temperature detector, a controlling circuitry, a voltage generator, and an output stage circuitry. The temperature detector is coupled to a control terminal of the power transistor and is configured to generate temperature detection information by detecting an ambient temperature. The controlling circuitry is coupled to the temperature detector and generates an activation signal by determining whether the ambient temperature is abnormal according to the temperature detection information. The voltage generator generates an operation power according to the activation signal. The output stage circuitry is coupled to the voltage generator, generates a driving voltage according to the operation power, and provides the driving voltage to the control terminal of the power transistor.

Based on the foregoing, the driving voltage generating device of the embodiments of the disclosure may detect the ambient temperature of the region where the power transistor is located. When the ambient temperature is excessively high, the driving voltage generating device may cease generating the driving voltage, and accordingly cease the operation of the power transistor. As a result, the power transistor may be ensured to operate in an SOA at a safe ambient temperature.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
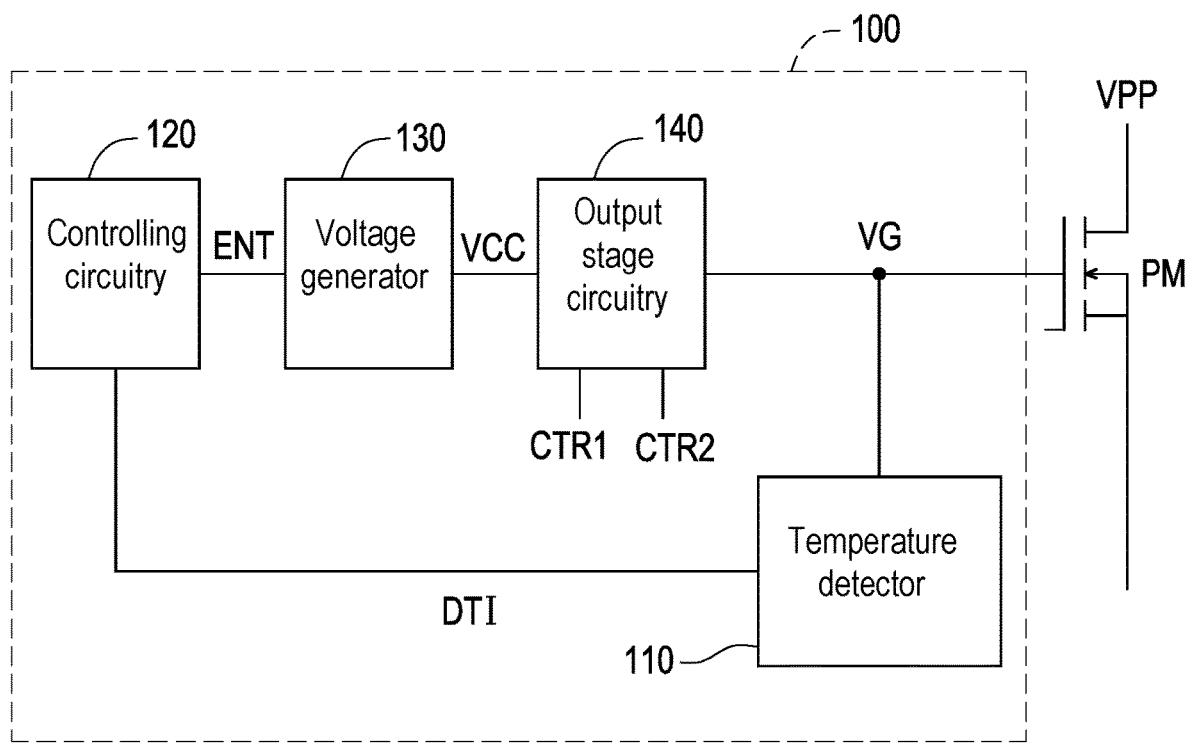
FIG. 1 is a schematic diagram of a driving voltage generating device of an embodiment of the disclosure.

With reference to FIG. 1, FIG. 1 is a schematic diagram of a driving voltage generating device of an embodiment of the disclosure. A driving voltage generating device 100 is configured to drive a power transistor PM. The driving voltage generating device 100 generates a driving voltage VG, and provides the driving voltage VG to a control terminal of the power transistor PM. One terminal of the power transistor PM receives a power voltage VPP, and another terminal of the power transistor PM may be coupled to a load circuit. The driving voltage generating device 100 includes a temperature detector 110, a controlling circuitry 120, a voltage generator 130, and an output stage circuitry 140. The temperature detector 110 is coupled to the control terminal of the power transistor PM, and is configured to generate temperature detection information DTI by detecting an ambient temperature of the region where the power transistor PM is located. The controlling circuitry 120 is coupled to the temperature detector 110. The controlling circuitry 120 receives the temperature detection information DTI generated by the temperature detector 110 generates an activation signal ENT by determining whether the ambient temperature of the region where the power transistor PM is located is abnormal.

The voltage generator 130 is coupled to the controlling circuitry 120. The voltage generator 130 receives the activation signal ENT generated by the controlling circuitry 120, and generates an operation power VCC according to the activation signal ENT. The output stage circuitry 140 is coupled to the voltage generator 130 and generates the driving voltage VG according to the operation power VCC provided by the voltage generator 130.

To be specific, when the controlling circuitry 120 determines that the ambient temperature of the region where the power transistor PM is located is abnormal (for example, the ambient temperature is higher than a predetermined threshold), the controlling circuitry 120 may generate the activation signal ENT so that the voltage generator 130 ceases providing the operation power VCC. Correspondingly, the output stage circuitry 140 may cease generating the driving voltage VG for turning on the power transistor PM, which ensures that the power transistor PM may not be damaged due to improper operation in an over-temperature state.

In addition, when the controlling circuitry 120 determines that the ambient temperature of the region where the power transistor PM is located is not abnormal, the controlling circuitry 120 may generate the activation signal ENT so that the voltage generator 130 normally provides the operation power VCC. Correspondingly, the output stage circuitry 140 may normally generate the driving voltage VG according to the operation power VCC so that the power transistor PM may operate normally.

In this embodiment, when the ambient temperature of the region where the power transistor PM is located is not abnormal, the voltage generator 130 may generate the operation power VCC according to a voltage-boosting operation. Comparatively, when the ambient temperature of the region where the power transistor PM is located is abnormal, the voltage generator 130 may cease the voltage-boosting operation so that the operation power VCC is equal to a reference ground voltage.

In other words, when the ambient temperature of the region where the power transistor PM is located is not abnormal, the output stage circuitry 140 may not be able to generate the driving voltage VG that effectively drives the power transistor PM, so that the power transistor PM is maintained in the OFF state.

Figure 2:
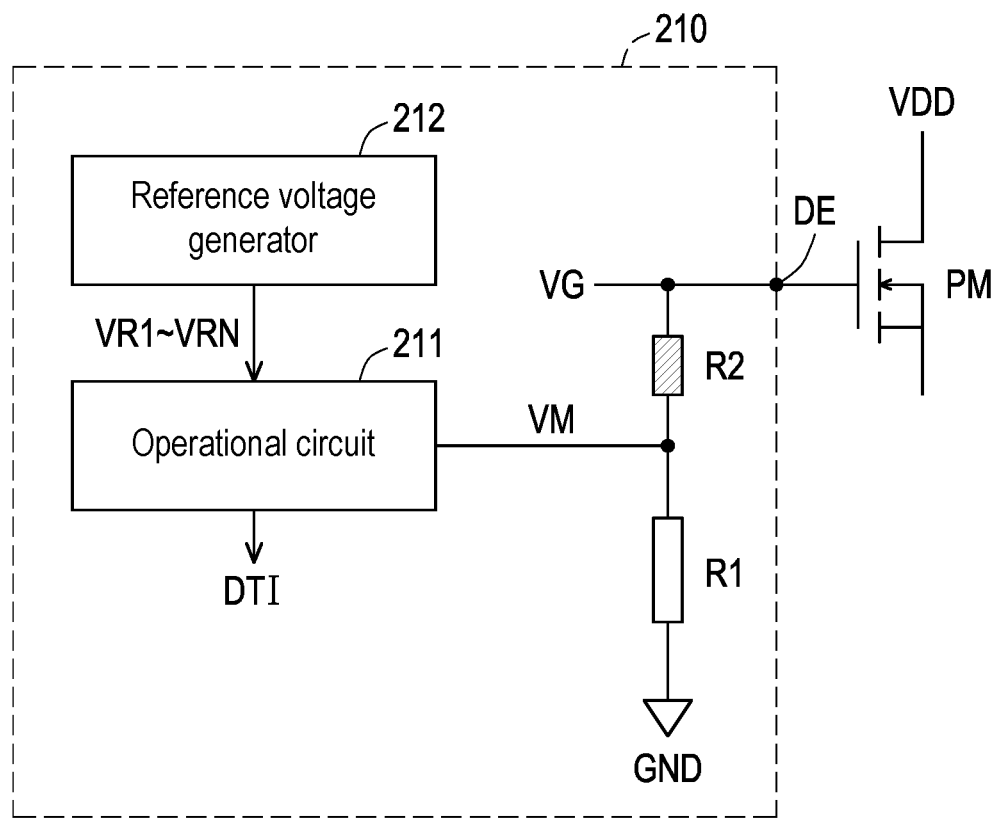
FIG. 2 is a schematic diagram of a temperature detector in a driving voltage generating device of an embodiment of the disclosure.

Next, with reference to FIG. 2, FIG. 2 is a schematic diagram of a temperature detector in a driving voltage generating device of an embodiment of the disclosure. A temperature detector 210 is coupled to the control terminal of the power transistor PM. The temperature detecting device 210 includes an operational circuit 211, a reference voltage generator 212, a first resistor R1, and a second resistor R2. One terminal of the first resistor R1 is coupled to a detection terminal DE, and receives the driving voltage VG on the detection terminal DE. The detection terminal DE is coupled to the control terminal of the power transistor PM. Another terminal of the first resistor R1 is coupled to the operational circuit 211 and to a first terminal of the second resistor R2. A second terminal of the second resistor R2 receives a reference ground voltage GND. The first resistor R1 and the second resistor R2 form a voltage-dividing circuit that is configured to divide a voltage difference between the driving voltage VG and the reference ground voltage GND, and accordingly generates a monitoring voltage VM. In this embodiment, the reference ground voltage GND may be 0 volt (V).

In addition, the operational circuit 211 may receive the monitoring voltage VM, compare the monitoring voltage VM with a plurality of reference voltages VR1 to VRN, and generate a plurality of comparison results. Furthermore, the operational circuit 211 may perform operations on the comparison results and generate the temperature detection information DTI.

Figure 3:
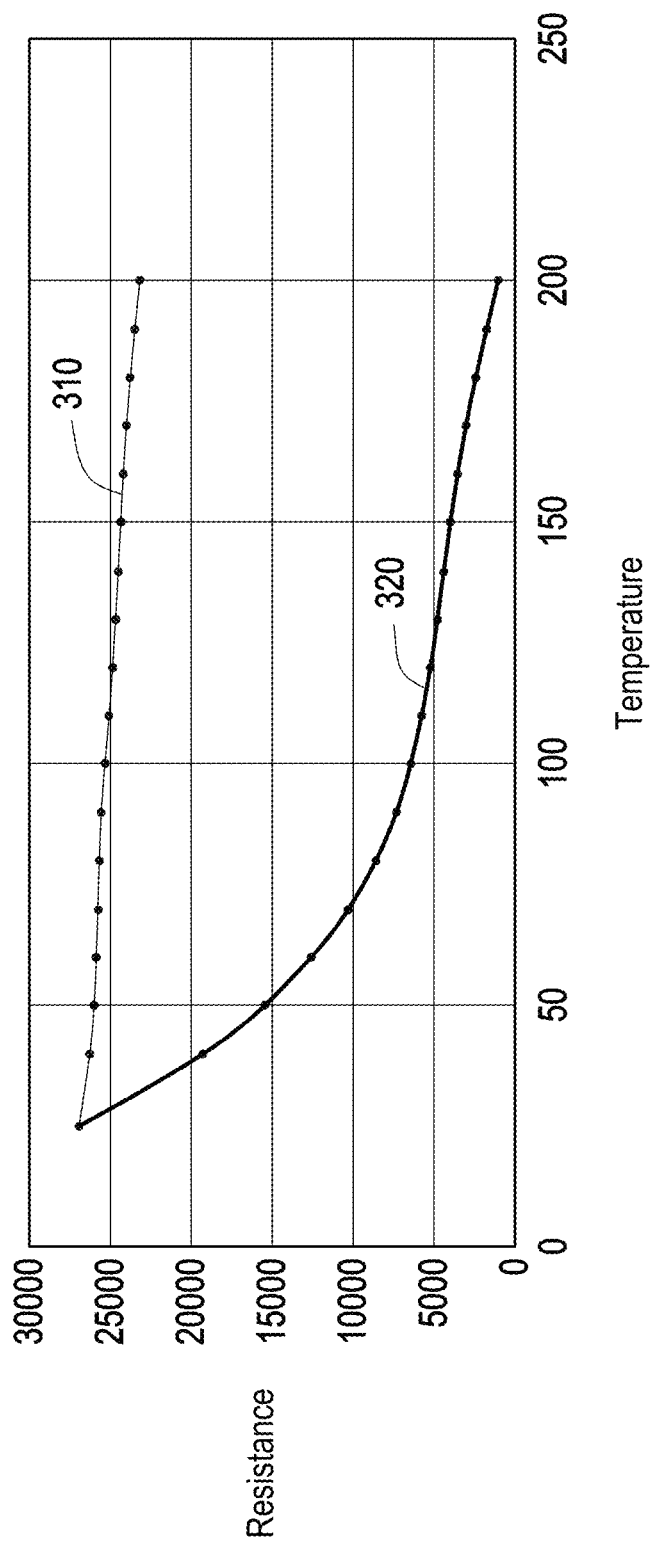
FIG. 3 shows relationship lines between temperature changes and resistances of a poly-silicon resistor and a silicon carbide diffusion resistor.

In the embodiment of the disclosure, the first resistor R1 may be a poly-silicon resistor, and the second resistor R2 may be a silicon carbide diffusion resistor. Here, reference may be made to FIG. 3 together. FIG. 3 shows relationship lines between temperature changes and resistances of a poly-silicon resistor and a silicon carbide diffusion resistor. In FIG. 3, line 310 is a relationship line between temperature changes and a resistance of the first resistor R1 (a poly-silicon resistor), and line 320 is a relationship line between temperature changes and a resistance of the second resistor R2 (a silicon carbide diffusion resistor). As can be found from FIG. 3, the resistance of the first resistor R1 is relatively not sensitive to temperature changes. Moreover, the variation rate of the resistance of the first resistor R1 is relatively low within a certain range of temperature changes. Comparatively, the resistance of the second resistor R2 is relatively sensitive to temperature changes. Moreover, the variation rate of the resistance of the second resistor R2 is relatively high within a certain range of temperature changes.

With reference to FIG. 2 again, as can be known from lines 310 and 320 of FIG. 3, when the temperature is changed, the voltage-dividing ratio of the voltage-dividing circuit formed by the first resistor R1 and the second resistor R2 is changed according to the relatively great change in the resistance of the second resistor R2. In other words, the monitoring voltage VM generated by the first resistor R1 and the second resistor R2 may be changed in relation to temperature changes.

Further, the operational circuit 211 may receive a plurality of preset reference voltages VR1 to VRN. The reference voltages VR1 to VRN may be set according to the variation range of the monitoring voltage VM that is generated according to the temperature range to be detected. Moreover, the reference voltages VR1 to VRN may respectively correspond to a plurality of temperatures. Specifically, taking the reference voltage VR1 corresponding to a temperature T1 as an example, at the temperature T1, the voltage-dividing ratio formed by the resistances of the first resistor R1 and the second resistor R2 may divide the driving voltage VG to generate a monitoring voltage VM equal to the reference voltage VR1. If the reference voltage VRN corresponds to a temperature TN, it indicates that, at the temperature TN, the voltage-dividing ratio formed by the resistances of the first resistor R1 and the second resistor R2 may divide the driving voltage VG to generate a monitoring voltage VM equal to the reference voltage VRN.

Based on the above, the operational circuit 211 may know the temperature detection information for indicating the current temperature through comparing each of the reference voltages VR1 to VRN with the monitoring voltage VM, through calculating the monitoring voltage VM is between which of the reference voltages VR1 to VRN, or through calculating the monitoring voltage VM is equal to which of the reference voltages VR1 to VRN.

To be specific, the operational circuit 211 may generate comparison results of a plurality of digital values by comparing each of the reference voltages VR1 to VRN with the monitoring voltage VM. Taking the reference voltage VR1 as an example, when the corresponding comparison result is a first logical value, it may indicate that the monitoring voltage VM is greater than the reference voltage VR1; when the corresponding comparison result is a second logical value, it may indicate that the monitoring voltage VM is not greater than the reference voltage VR1. The first logical value may be logic 0 (or logic 1), and the second logical value may be logic 1 (or logic 0).

The operational circuit 211 may further perform operations on the comparison results. Specifically, if the reference voltages includes the reference voltage VR1 to the reference voltage VRN arranged in order of magnitude, the operational circuit 211 may generate a first comparison result to an N-th comparison result respectively corresponding to the reference voltage VR1 to the reference voltage VRN. The operational circuit 211 may compare the i-th comparison result and the i+1-th comparison result (e.g., through an XOR operation), and accordingly generate an i-th bit of the temperature detection information, where N is a positive integer greater than 1, and i is a positive integer greater than 0 and less than N.

In other embodiments of the disclosure, the positions of the first resistor R1 and the second resistor R2 may be exchanged with each other, and the monitoring voltage VM that is changed according to temperature changes may similarly be generated.

Figure 4:
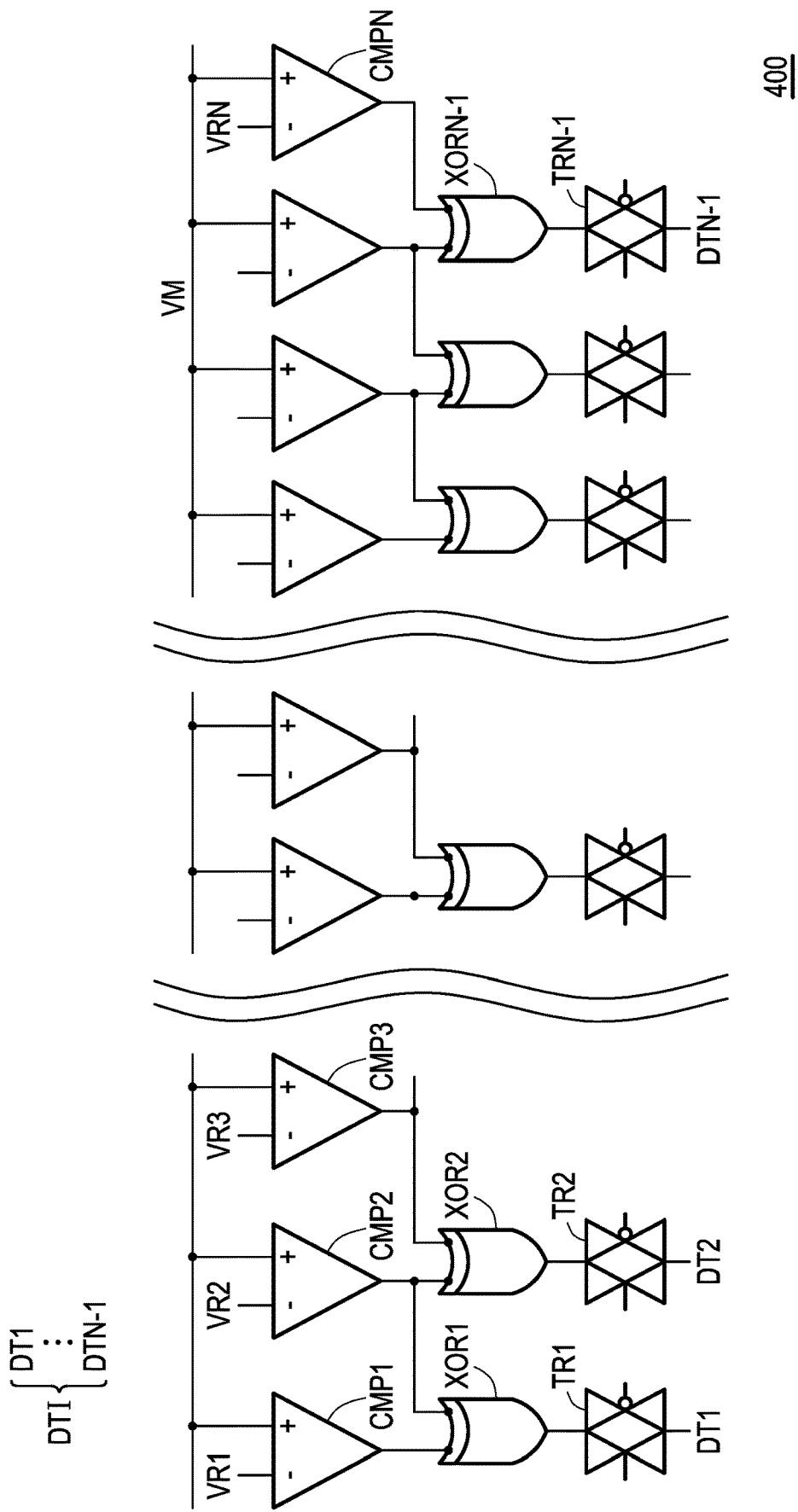
FIG. 4 is a schematic diagram of an operational circuit in a temperature detecting device of an embodiment of the disclosure.

Next, with reference to FIG. 4, FIG. 4 is a schematic diagram of an operational circuit in a temperature detecting device of an embodiment of the disclosure. An operational circuit 400 includes comparators CMP1 to CMPN and XOR gates XOR1 to XORN-1. Negative input terminals of the comparators CMP1 to CMPN respectively receive the reference voltages VR1 to VRN, and positive input terminals of the comparators CMP1 to CMPN collectively receive the monitoring voltage VM. The comparators CMP1 to CMPN1 respectively generate comparison results CR1 to CRN. The comparators CMP1 to CMPN compare the monitoring voltage VM with the reference voltages VR1 to VRN, and accordingly obtain the voltage interval where the monitoring voltage VM is located by comparison. For example, when the monitoring voltage VM is greater than the reference voltage VR2 and less than the reference voltage VR3, the comparators CMP1 and CMP2 may generate comparison results CR1 and CR2 equal to logic 1, and the comparators CMP3 to CMPN may respectively generate comparison results CR3 to CRN equal to logic 0.

Each of the XOR gates XOR1 to XORN-1 receives two of the comparison results CR1 to CRN. The XOR gates XOR1 to XORN-1 respectively generate a plurality of bits DT1 to DTN-1 of the temperature detection information DTI. Corresponding to the sequentially arranged reference voltages VR1 to VRN, each of the XOR gates XOR1 to XORN-1 may receive two adjacent comparison results. For example, the XOR gate XOR1 may receive the comparison results CR1 and CR2, the XOR gate XOR2 may receive the comparison results CR2 and CR3, and so on and so forth. Each of the XOR gates XOR1 to XORN-1 is configured to generate the temperature detection information DTI by determining whether the two received comparison results are the same. For an XOR gate that determines that the two received comparison results are different, the bits (e.g., equal to logic 1) of the temperature detection information DTI generated by the XOR gate may indicate the interval where the current temperature is located.

In other embodiments of the disclosure, the XOR gates XOR1 to XORN-1 may be replaced by applying an XNOR gate.

In this embodiment, output terminals of the XOR gates XOR1 to XORN-1 may be respectively coupled to a plurality of transmission gates TR1 to TRN-1. The bits DT1 to DTN-1 of the temperature detection information DTI may be respectively output through the transmission gates TR1 to TRN-1. The transmission gates TR1 to TRN-1 may synchronously output the bits DT1 to DTN-1 of the temperature detection information DTI at the same time point according to a control signal. Alternatively, the transmission gates TR1 to TRN-1 may also time-divisionally output the bits DT1 to DTN-1 of the temperature detection information DTI at different time points according to a plurality of control signals.

In other embodiments of the disclosure, it is possible that the transmission gates TR1 to TRN-1 are not disposed in the operational circuit 400, and the XOR gates XOR1 to XORN-1 directly output the bits DT1 to DTN-1 of the temperature detection information DTI.

An example is provided below to describe the operation details of the temperature detector 400. With reference to True Value Table 1 below, True Value Table 1 is a true value table of the temperature detection information DTI generated by the temperature detector 400. In the example of True Value Table 1, the ambient temperature is between 100 degrees Celsius (° C.) and 110° C., for example.

| | | | Temperature detection |
| Temperature | Reference voltage | Voltage | information DTI |
| --- | --- | --- | --- |
| 25° C. | VR1 | 10 | DT1 = L |
| 40° C. | VR2 | 8.45 | DT2 = L |
| 50° C. | VR3 | 7.46 | DT3 = L |
| 60° C. | VR4 | 6.53 | DT4 = L |
| 70° C. | VR5 | 5.72 | DT5 = L |
| 80° C. | VR6 | 5.03 | DT6 = L |
| 90° C. | VR7 | 4.47 | DT7 = L |
| 100° C. | VR8 | 4.06 | DT8 = L |
| 110° C. | VR9 | 3.74 | DT9 = H |
| 120° C. | VR10 | 3.48 | DT10 = L |
| . | . | . | . |
| . | . | . | . |
| 200° C. | VRN | 0.87 | |

True Value Table 1:

In True Value Table 1, the reference voltages VR1 to VRN set in the temperature detector 400 respectively correspond to a plurality of temperatures. The reference voltages VR1 to VRN respectively have a plurality of voltages arranged in order of magnitude from small to large. Through the comparison by the comparators CMP1 to CMPN and the operation by the XOR gates XOR1 to XORN-1, in the embodiment of True Value Table 1, when the ambient temperature is between 110° C. and 120° C. (and the monitoring voltage VM is between 3.74V and 3.48V), the bit DT9 of the temperature detection information DTI generated by the temperature detector 400 may be a logic high level (H), and the other bits are each a logic low level (L).

Figure 5A:
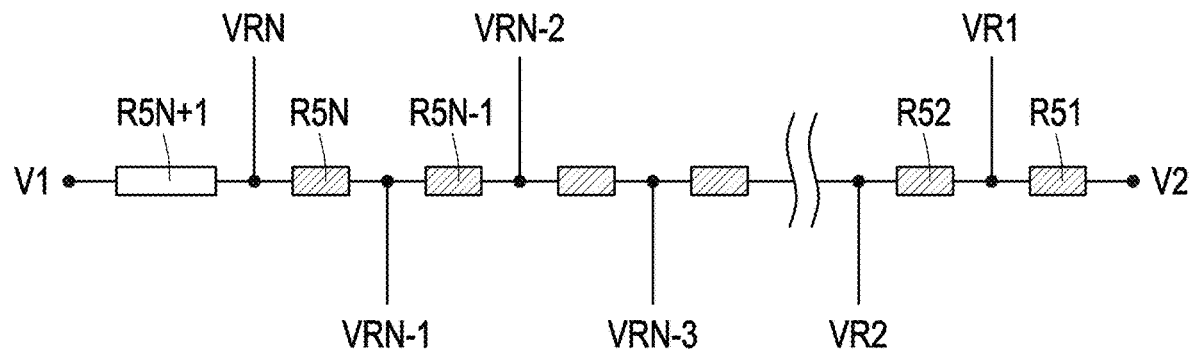
FIG. 5A and FIG. 5B are schematic diagrams of reference voltage generators in a temperature detecting device of different embodiments of the disclosure.
Figure 5B:
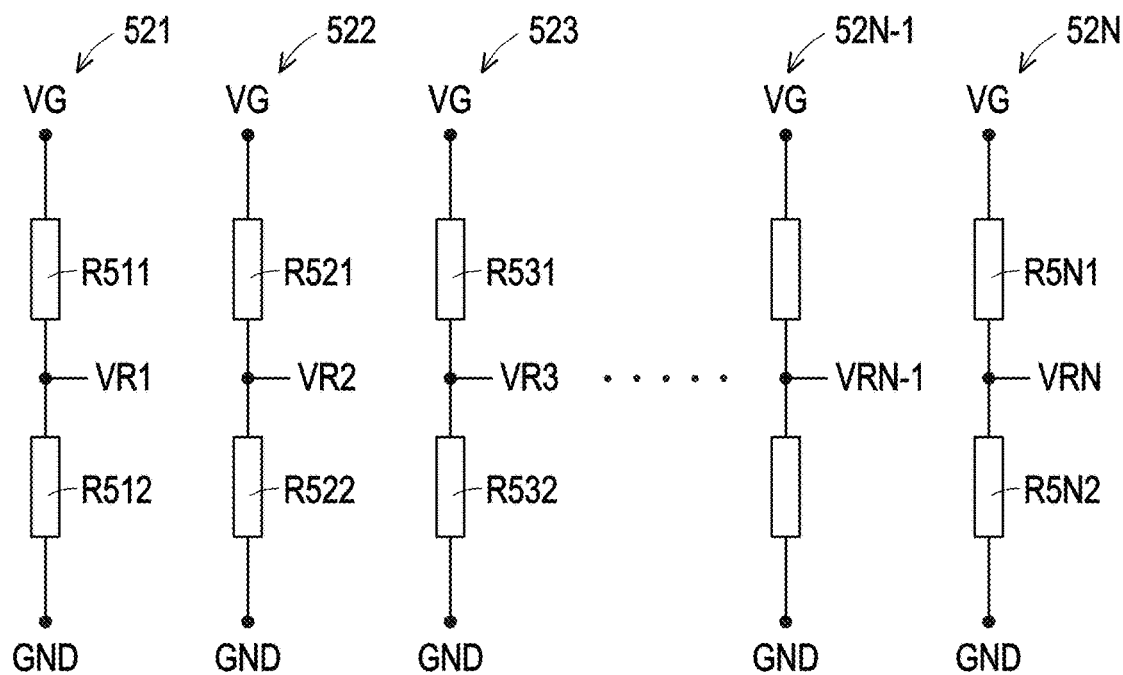

Next, with reference to FIG. 5A and FIG. 5B, FIG. 5A and FIG. 5B are schematic diagrams of reference voltage generators in a temperature detecting device of different embodiments of the disclosure. In the embodiments of the disclosure, a reference voltage received by an operational circuit may be generated by a reference voltage generator. In FIG. 5A, a reference voltage generator 501 includes a plurality of resistors R51 to R5N+1. The resistors R51 to R5N+1 are connected in series and form a voltage-dividing circuit. The voltage-dividing circuit formed by the resistors R51 to R5N+1 has one terminal that receives a voltage V1 and another terminal that receives a voltage V2. Taking the voltage V1 being greater than the voltage V2 as an example, the resistors R51 to R5N+1 may generate the reference voltages VR1 to VRN by dividing a voltage difference between the voltage V1 and the voltage V2.

In this embodiment, the voltage V1 may be equal to the driving voltage VG in FIG. 1 embodiment, and the voltage V2 may be a reference ground voltage (e.g., 0 V).

To prevent the reference voltages VR1 to VRN from being changed under temperature changes, the resistors R51 to R5N+1 may be constructed by applying poly-silicon resistors that are relatively not sensitive to temperature changes. In this embodiment, resistances of the resistors R51 to R5N may be the same, and a resistance of the resistor R5N+1 may be different from the resistances of the resistors R51 to R5N. For example, the resistance of the resistor R5N+1 may be greater than the resistance of the resistor R51.

In FIG. 5B, a reference voltage generator 502 includes a plurality of voltage-dividing circuits 521 to 52N. Each of the voltage-dividing circuits 521 to 52N is coupled between the driving voltage VG and the reference ground voltage GND. The voltage-dividing circuit 521 includes resistors R511 and R512 coupled in series, the voltage-dividing circuit 522 includes resistors R521 and R522 coupled in series, the voltage-dividing circuit 523 includes resistors R531 and R532 coupled in series, . . . , and the voltage-dividing circuit 52N includes resistors R5N1 and R5N2 coupled in series. The voltage-dividing circuits 521 to 52N respectively generates the reference voltages VR1 to VRN by dividing the driving voltage VG. To prevent the reference voltages VR1 to VRN from being changed under temperature changes, the resistors R511 to R5N2 may be constructed by applying poly-silicon resistors that are relatively not sensitive to temperature changes.

Here, the number of the reference voltages VR1 to VRN may be set according to the resolution of the temperature detection information in temperature detection. The number of the reference voltages VR1 to VRN may be adjusted by the designer depending on the required resolution of the temperature detection information, and is not particularly limited.

Figure 6:
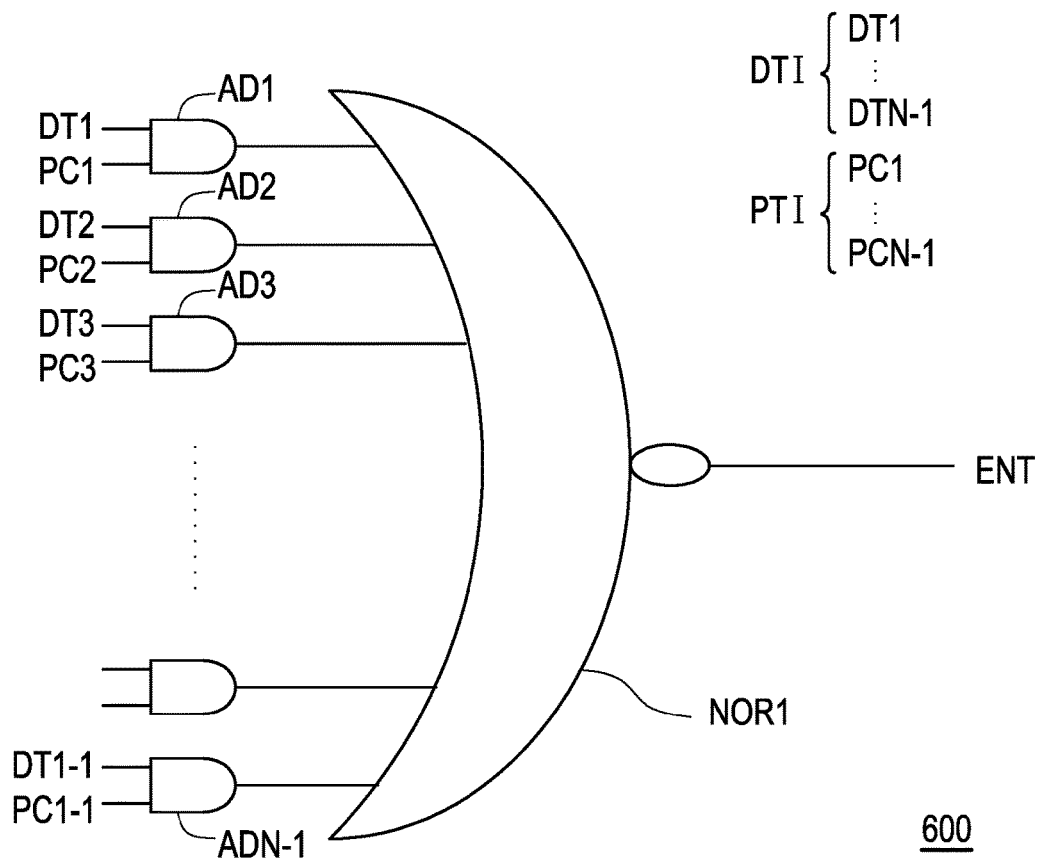
FIG. 6 is a schematic diagram of a controlling circuitry in a driving voltage generating device of an embodiment of the disclosure.

Next, with reference to FIG. 6, FIG. 6 is a schematic diagram of a controlling circuitry in a driving voltage generating device of an embodiment of the disclosure. A controlling circuitry 600 is configured to generate the activation signal ENT by comparing the temperature detection information DTI generated by a temperature detector with predetermined threshold information PCI. In this embodiment, the controlling circuitry 600 includes AND gates AD1 to ADN-1 and an NOR gate NOR1. Each of the AND gates AD1 to ADN-1 has two input terminals. A plurality of first input terminals of the AND gates AD1 to ADN-1 respectively receive the bits DT1 to DTN-1 of the temperature detection information DTI, and a plurality of second input terminals of the AND gates AD1 to ADN-1 respectively receive a plurality of bits PCI to PCN-1 of the predetermined threshold information PCI.

A plurality of output terminals of the AND gates AD1 to ADN-1 are respectively coupled to a plurality of input terminals of the NOR gate NOR1. An output terminal of the NOR gate NOR1 may generate the activation signal ENT.

Regarding the operation details of the controlling circuitry 600, the controlling circuitry 600 may perform respective AND logical operations on the bits DT1 to DTN-1 of the temperature detection information DTI and the bits PC to PCN-1 of the predetermined threshold information PCI, then perform an NOR logical operation on a plurality of results of the AND logical operations, and accordingly generate the activation signal ENT. For the related true value table, reference may be made to True Value Table 2:

| Temperature | Predetermined threshold information PCI | Temperature detection information DTI |
|---|---|---|
| 25° C. | PC1 = L | DT1 = L |
| 40° C. | PC2 = L | DT2 = L |
| 50° C. | PC3 = L | DT3 = L |
| 60° C. | PC4 = L | DT4 = L |
| 70° C. | PC5 = L | DT5 = L |
| 80° C. | PC6 = L | DT6 = L |
| 90° C. | PC7 = L | DT7 = L |
| 100° C. | PC8 = L | DT8 = L |
| 110° C. | PC9 = H | DT9 = H |
| 120° C. | PC10 = H | DT10 = L |
| . | . | . |
| . | . | . |
| . | . | . |
| 200° C. | PCN-1 = H | DTN-1 = L |

In True Value Table 2, the bits PC to PCN-1 of the predetermined threshold information PCI may respectively correspond to a plurality of temperatures, and the bits PCI to PCN-1 of the predetermined threshold information PCI may be set for temperatures in an over-temperature state. In this embodiment, it is assumed that an over-temperature state occurs when the ambient temperature is greater than 110° C. Among the bits PCI to PCN-1 of the predetermined threshold information PCI, the bit PC9 corresponding to 110° C. and all the following bits PC10 to PCN-1 are each set to a logic high level (H), and the bits PCI to PC8 are each set to a logic low level (L).

Following the example of True Value Table 1, among the bits DT1 to DTN-1 of the temperature detection information DTI generated by the temperature detector, the bit DT9 is a logic high level (H). Therefore, the AND gate corresponding to the bits DT9 and PC9 may generate an operation result equal to a logic high level (H), so that the NOR gate NOR1 generates an activation signal ENT equal to a logic low level. Here, the activation signal ENT at the logic low level may cease generating the operation power by the voltage generator in the subsequent stage.

Comparatively, in other examples, if one of the bits DT1 to DT8 of the temperature detection information DTI is a logic high level (H), it indicates that over-temperature has not occurred, and the controlling circuitry 600 may generate the activation signal ENT at a logic high level, so that the voltage generator in the subsequent stage provides the operation power normally.

Figure 7:
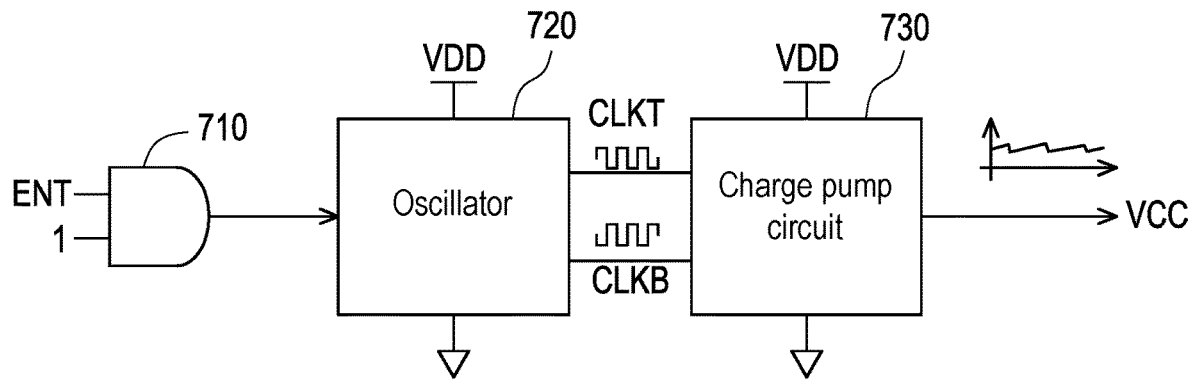
FIG. 7 is a schematic diagram of a voltage generator in a driving voltage generating device of an embodiment of the disclosure.

Next, with reference to FIG. 7, FIG. 7 is a schematic diagram of a voltage generator in a driving voltage generating device of an embodiment of the disclosure. A voltage generator 700 includes an AND gate 710, an oscillator 720, and a charge pump circuit 730. One terminal of the AND gate 710 receives the activation signal ENT, and another terminal of the AND gate 710 may receive logic 1. The AND gate 710 may output an inverted signal of the activation signal ENT to cease or initiate the operation of the oscillator 720. The oscillator 720 receives a power voltage VDD, and generates a clock signal CLKT and an inverted clock signal CLKB according to the activation signal ENT being at a logic high level (H). The charge pump circuit 730 receives the clock signal CLKT and the inverted clock signal CLKB and generates the operation power VCC by performing a charge pump operation according to the clock signal CLKT and the inverted clock signal CLKB and based on the power voltage VDD.

In this embodiment, the oscillator 720 and the charge pump circuit 730 may be implemented by applying an oscillator circuit and a charge pump circuit in any form known to those ordinarily skilled in the art, and are not particularly limited.

Figure 8:
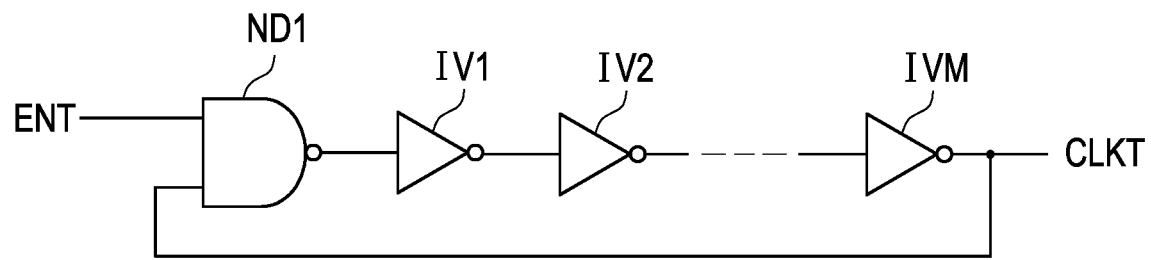
FIG. 8 is a schematic diagram of the oscillator 720 in the embodiment of FIG. 7 of the disclosure.

Reference may be made to FIG. 8 for a schematic diagram of the oscillator 720 in the embodiment of FIG. 7 of the disclosure. In this embodiment, the oscillator 720 may be a ring oscillator and includes an NAND gate ND1 and a plurality of inverters IV1 to IVM. The inverters IV1 to IVM are connected in series with each other. An input terminal of the inverter IV1 is coupled to an output terminal of the NAND gate ND1. An output terminal of the inverter IVM generates the clock signal CLKT and is coupled to an input terminal of the NAND gate ND1. Another input terminal of the NAND gate ND1 receives the activation signal ENT. The frequency of the clock signal CLKT may be determined by the propagation delay of the NAND gate ND1 and the inverters IV1 to IVM. In this embodiment, the inverters IV1 to IVM is in an odd number.

Figure 9:
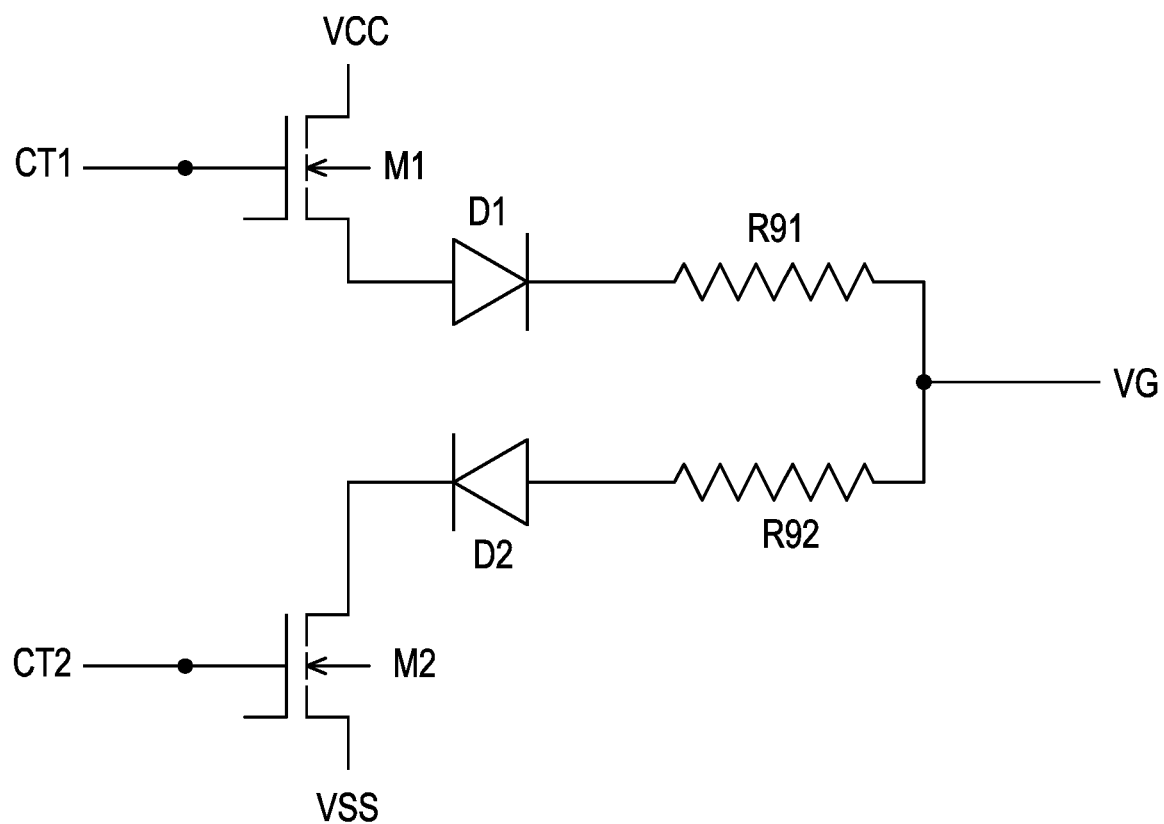
FIG. 9 is a schematic diagram of an output stage circuitry in a driving voltage generating device of an embodiment of the disclosure.

Next, with reference to FIG. 9, FIG. 9 is a schematic diagram of an output stage circuitry in a driving voltage generating device of an embodiment of the disclosure. An output stage circuitry 900 includes transistors M1 and M2, diodes D1 and D2, and resistors R91 and R92. A first terminal of the transistor M1 receives the operation power VCC. A second terminal of the transistor M1 is coupled to an anode terminal of the diode D1. A cathode terminal of the diode D1 is coupled to a first terminal of the resistor R91. A second terminal of the resistor R91 is configured to provide the driving voltage VG. A first terminal of the transistor M2 receives a reference ground voltage VSS. A second terminal of the transistor M2 is coupled to a cathode terminal of the diode D2. An anode terminal of the diode D2 is coupled to a first terminal of the resistor R92. A second terminal of the resistor R92 is coupled to the second terminal of the resistor R91.

The transistors M1 and M2 are respectively controlled by control signals CT1 and CT2. The control signals CT1 and CT2 may be generated by an external circuit depending on the operation requirements of the power transistor. When the transistor M1 is turned on, the output stage circuitry 900 may generate a driving voltage VG equal to the operation power VCC. When the transistor M2 is turned on, the output stage circuitry 900 may generate a driving voltage VG equal to the reference ground voltage VSS.

In this embodiment, the voltage generator may generate an operation power VCC equal to 0V when over-temperature is detected. Under such circumstances, the driving voltage VG generated by the output stage circuitry 900 may not be able to drive the power transistor, and the power transistor may be maintained in the OFF state, reducing the likelihood of damage due to operation at a high temperature.

Figure 10:
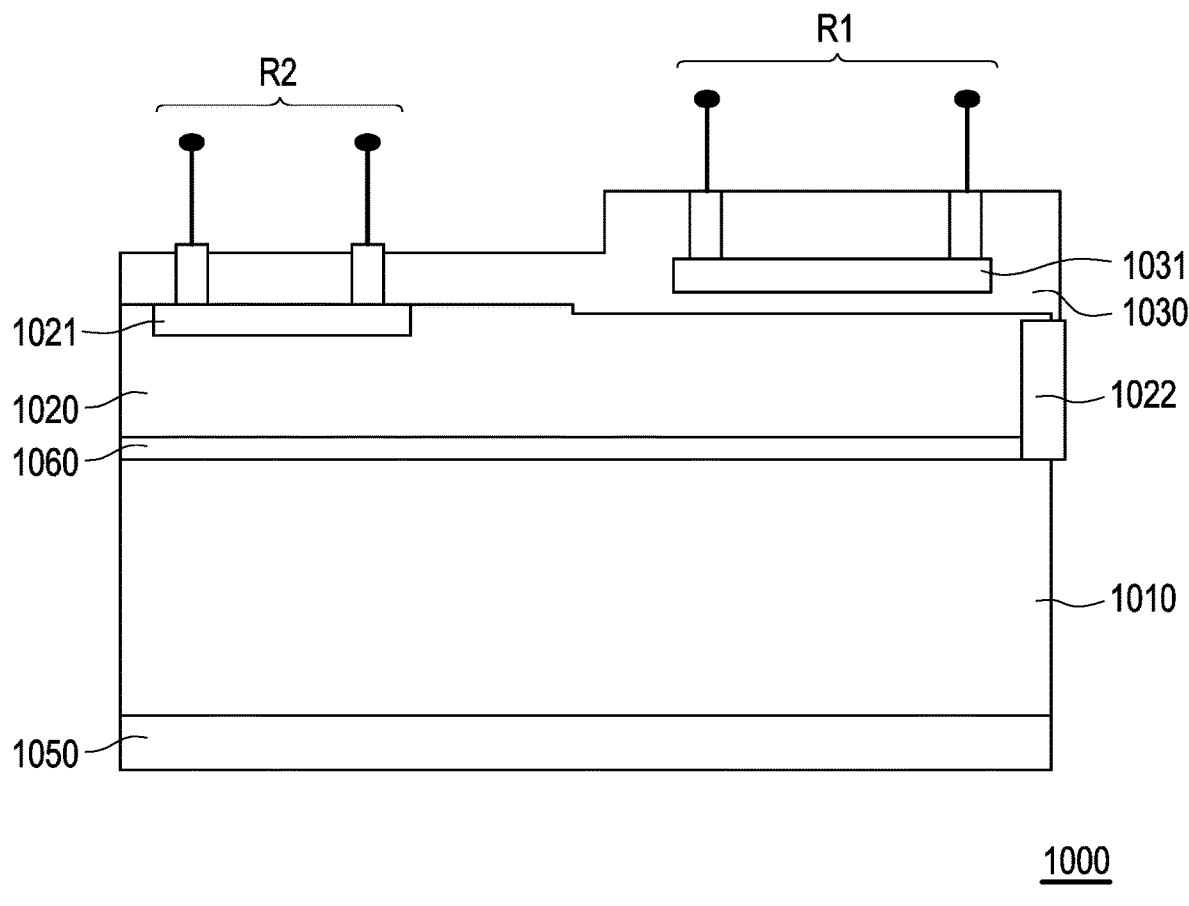
FIG. 10 is a structural diagram of a first resistor and a second resistor in a temperature detecting device of an embodiment of the disclosure.
Figure 11:
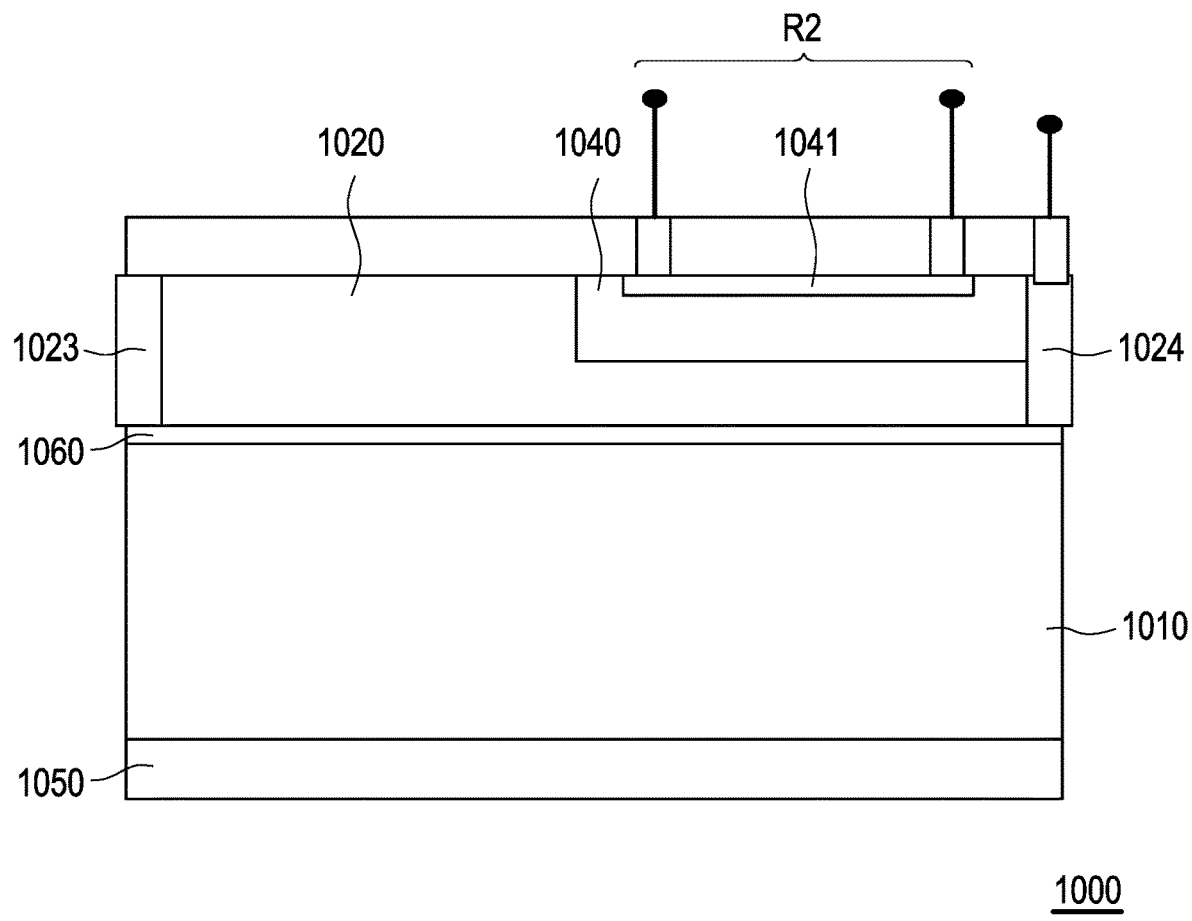
FIG. 11 is a structural diagram of a second resistor in a temperature detecting device of another embodiment of the disclosure.

With reference to FIG. 10 and FIG. 11, FIG. 10 is a structural diagram of a first resistor and a second resistor in a temperature detecting device of an embodiment of the disclosure, and FIG. 11 is a structural diagram of a second resistor in a temperature detecting device of another embodiment of the disclosure. In FIG. 10, the first resistor R1 and the second resistor R2 may be disposed in a same integrated circuit 1000. The integrated circuit 1000 includes a drift region 1010, a drift region 1020, an insulating layer 1030, a heavily doped layer 1050, and a doped region 1060. The drift region 1020 may be formed on the drift region 1010. The doped region 1060 is provided between the drift region 1020 and the drift region 1010. The conductivity type of the doped region 1060 is opposite to that of the drift region 1020 and the drift region 1010. The insulating layer 1030 may cover the drift region 1020. The first resistor R1 may be formed of a polysilicon layer 1031 and disposed in the insulating layer 1030. In addition, the second resistor R2 may be formed of a P-type silicon carbide diffusion layer 1021 and disposed in the drift region 1020. Furthermore, the heavily doped layer 1050 may be disposed beneath the drift region 1010. For example, the drift region 1010 may be an N-type drift region, and the heavily doped layer 1050 may be an N+-type heavily doped layer.

Moreover, a buried-type well region 1022 may be provided in the drift region 1020 to provide a potential contact.

In FIG. 11, when the second resistor R2 is an N-type silicon carbide diffusion resistor, the integrated circuit 1000 may additionally have a P-type well region 1040. The P-type well region 1040 is disposed in the drift region 1020. The second resistor R2 may be formed of an N-type silicon carbide diffusion layer 1041. The N-type silicon carbide diffusion layer 1041 may be formed in the P-type well region 1040.

In addition, buried-type well regions 1023 and 1024 may also be provided in the drift region 1020 to provide a plurality of potential contacts.

Figure 12:
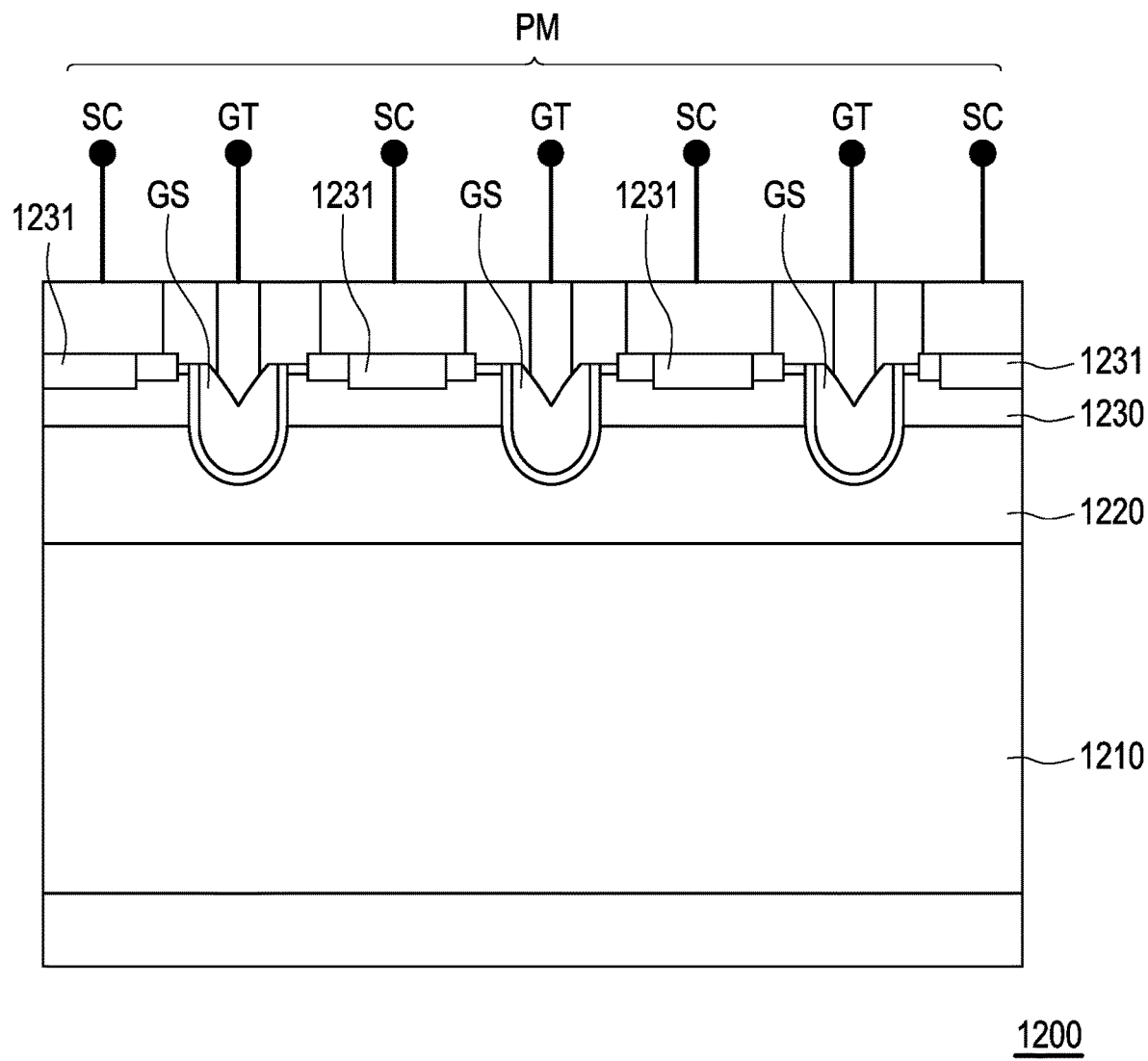
FIG. 12 is a schematic structural diagram of a power transistor in an electronic device of an embodiment of the disclosure.

With reference to FIG. 12, FIG. 12 is a schematic structural diagram of a power transistor in an electronic device of an embodiment of the disclosure. The power transistor PM is formed on an integrated circuit 1200. The integrated circuit 1200 includes drift regions 1210 and 1220 and a P-type well region 1230. The drift region 1220 is formed on the drift region 1210. The P-type well region 1230 is formed on the drift region 1220. A plurality of gate structures GS may be formed in the P-type well region 1230 and the drift region 1220, and collectively form a gate GT of the power transistor PM. In addition, a plurality of P-type heavily doped regions 1231 are respectively formed on a plurality of regions of the P-type well region 1230, and collectively form a source SC of the power transistor PM.

Incidentally, a drain of the power transistor PM may be formed at the backside of the integrated circuit 1200.

As can be known based on FIG. 10, FIG. 11, and FIG. 12, in the embodiments of the disclosure, the power transistor PM and the first resistor R1 and the second resistor R2 that generate the monitoring voltage may be integrated on the same integrated circuit. As a result, temperature changes on the integrated circuit can be quickly reflected on the monitoring voltage, and the temperature detecting device can quickly detect the state of temperature changes and generate the temperature detection information. Correspondingly, in the embodiments of the disclosure, the driving voltage generating device may cease generating the operation power by the voltage generator in response to over-temperature, and may maintain the power transistor to be turned off, reducing the likelihood of damage due to operation at a high temperature.

In summary of the foregoing, in the embodiments of the disclosure, the driving voltage generating device detects the ambient temperature of the region where the power transistor is located through the temperature detector. When over-temperature occurs, the voltage generator of the driving voltage generating device ceases providing the operation power to the output stage circuitry. As a result, the driving voltage generated by the driving voltage generating device is not sufficient to turn on the power transistor, achieving over-temperature protection.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A driving voltage generating device configured to drive a power transistor, the driving voltage generating device comprising:
 a temperature detector coupled to a control terminal of the power transistor, and configured to generate temperature detection information by detecting an ambient temperature;
 a controlling circuitry coupled to the temperature detector, and generating an activation signal by determining whether the ambient temperature is abnormal according to the temperature detection information;
 a voltage generator generating an operation power according to the activation signal; and
 an output stage circuitry coupled to the voltage generator, generating a driving voltage according to the operation power, and providing the driving voltage to the control terminal of the power transistor.

2. The driving voltage generating device according to claim 1, wherein the controlling circuitry generates the activation signal when the ambient temperature is greater than a predetermined threshold, such that the voltage generator ceases outputting the operation power.

3. The driving voltage generating device according to claim 2, wherein the controlling circuitry generates the activation signal by perform a logical operation on the temperature detection information and predetermined threshold information, wherein the predetermined threshold information comprises a digital value of the predetermined threshold.

4. The driving voltage generating device according to claim 3, wherein the controlling circuitry comprises:
 a plurality of AND gates respectively receiving a plurality of bits of the temperature detection information, and respectively receiving a plurality of bits of the predetermined threshold information; and
 a NOR gate having a plurality of input terminals coupled to output terminals of the AND gates, wherein the NOR gate generates the activation signal.

5. The driving voltage generating device according to claim 1, wherein the voltage generator comprises:
 an oscillator generating a clock signal according to the activation signal; and
 a charge pump circuit coupled to the oscillator, and generating the operation power according to the clock signal and based on a power voltage.

6. The driving voltage generating device according to claim 1, wherein the output stage circuitry comprises:
 a first transistor having a first terminal that receives the operation power and a control terminal that receives a first control signal;
 a second transistor having a first terminal that receives a reference ground voltage and a control terminal that receives a second control signal;
 a first diode having an anode terminal coupled to a second terminal of the first transistor; and
 a second diode has a cathode terminal coupled to a second terminal of the second transistor,
 wherein an anode terminal of the second diode and a cathode terminal of the first diode are coupled to each other and provide the driving voltage.

7. The driving voltage generating device according to claim 6, wherein the output stage circuitry further comprises:
 a first resistor coupled between the cathode terminal of the first diode and the control terminal of the power transistor; and
 a second resistor coupled between the anode terminal of the second diode and the control terminal of the power transistor.

8. The driving voltage generating device according to claim 1, wherein the temperature detector comprises:
 a first resistor and a second resistor coupled in series between the control terminal of the power transistor and a reference ground voltage, wherein the first resistor and the second resistor generate a monitoring voltage by dividing the driving voltage on the control terminal of the power transistor; and
 an operational circuit coupled to the first resistor and the second resistor, generating a plurality of comparison results by comparing the monitoring voltage with a plurality of reference voltages, and generating the temperature detection information by performing an operation on the comparison results,
 wherein the first resistor is a poly-silicon resistor and the second resistor is a silicon carbide diffusion resistor.

9. The driving voltage generating device according to claim 8, wherein the operational circuit comprises:
 a plurality of comparators respectively receiving the reference voltages, collectively receiving the monitoring voltage, and configured to generate the comparison results by comparing the monitoring voltage with the corresponding reference voltages; and
 a plurality of logical operators, wherein each of the logical operators performs a logical operation on two of the comparison results, and the logical operators are respectively configured to generate a plurality of bits of the temperature detection information.

10. The driving voltage generating device according to claim 9, wherein each of the logical operators is an XOR gate or an XNOR gate.

11. The driving voltage generating device according to claim 9, wherein the reference voltages comprise a first reference voltage to an N-th reference voltage arranged in order of magnitude, the comparators comprise a first comparator to an N-th comparator respectively corresponding to the first reference voltage to the N-th reference voltage, and the comparators respectively generate a first comparison result to an N-th comparison result,
 wherein each of the logical operators receives an i-th comparison result and the i+1-th comparison result, and generates an i-th bit of the temperature detection information, where N is a positive integer greater than 1, and i is a positive integer greater than 0 and less than N.

12. The driving voltage generating device according to claim 9, wherein the operational circuit further comprises:
 a plurality of transmission switches respectively coupled to output terminals of the logical operators, and outputting the bits of the temperature detection information according to a control signal.

13. The driving voltage generating device according to claim 8, wherein the temperature detector further comprises a reference voltage generator coupled to the operational circuit, the reference voltage generator being configured to generate the reference voltages and comprising:
  a voltage-dividing circuit having a first terminal that receives a second voltage and a second terminal that receives a third voltage, wherein the voltage-dividing circuit generates the reference voltages by dividing a difference of dividing the second voltage and the third voltage.

14. The driving voltage generating device according to claim 13, wherein the voltage-dividing circuit comprises:
  a plurality of third resistors sequentially coupled in series between the second voltage and the third voltage, wherein the third resistors generates the reference voltages by dividing a difference of dividing the second voltage and the third voltage, and the third resistors are poly-silicon resistors.

15. The driving voltage generating device according to claim 8, wherein the temperature detector further comprises a reference voltage generator coupled to the operational circuit, the reference voltage generator being configured to generate the reference voltages and comprising:
  a plurality of voltage-dividing circuits respectively configured to generate the reference voltages, each of the voltage-dividing circuits comprising:
    a third resistor and a fourth resistor connected in series with each other between a second voltage and a third voltage, and configured to generate the corresponding reference voltage by dividing a voltage difference between the second voltage and the third voltage, wherein the third resistor and the fourth resistor are poly-silicon resistors.

16. The driving voltage generating device according to claim 8, wherein a first terminal of the first resistor is coupled to the control terminal of the power transistor, a second terminal of the first resistor is coupled to a first terminal of the second resistor, and a second terminal of the second resistor receives the reference ground voltage.

17. The driving voltage generating device according to claim 8, wherein a first terminal of the second resistor is coupled to the control terminal of the power transistor, a second terminal of the second resistor is coupled to a first terminal of the first resistor, and a second terminal of the first resistor receives the reference ground voltage.

18. The driving voltage generating device according to claim 8, wherein the second resistor is an N-type silicon carbide diffusion resistor or a P-type silicon carbide diffusion resistor.

19. The driving voltage generating device according to claim 8, wherein, when the second resistor is a P-type silicon carbide diffusion resistor, the second resistor comprises:
  a P-type diffusion region disposed in a drift region.

20. The driving voltage generating device according to claim 8, wherein, when the second resistor is an N-type silicon carbide diffusion resistor, the second resistor comprises:
  an N-type diffusion region disposed in a well region, wherein the well region is disposed in a drift region.

* * * * *